United States Patent
Narita et al.

(10) Patent No.: US 9,873,170 B2
(45) Date of Patent: Jan. 23, 2018

(54) METHOD OF MANUFACTURING LIGHT EMITTING ELEMENT

(71) Applicant: NICHIA CORPORATION, Anan-shi (JP)

(72) Inventors: Junya Narita, Yoshinogawa (JP); Takuya Okada, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 15/079,052

(22) Filed: Mar. 24, 2016

(65) Prior Publication Data

US 2016/0284944 A1     Sep. 29, 2016

(30) Foreign Application Priority Data

| Mar. 24, 2015 | (JP) | 2015-060500 |
| Apr. 9, 2015 | (JP) | 2015-079935 |
| Nov. 26, 2015 | (JP) | 2015-230186 |

(51) Int. Cl.
  *H01L 33/00*   (2010.01)
  *B23K 26/40*   (2014.01)
  *H01L 33/32*   (2010.01)

(52) U.S. Cl.
  CPC ............ *B23K 26/40* (2013.01); *H01L 33/005* (2013.01); *H01L 33/0095* (2013.01); *H01L 33/32* (2013.01)

(58) Field of Classification Search
  None
  See application file for complete search history.

(56) References Cited

U.S. PATENT DOCUMENTS

| 6,194,742 B1 | 2/2001 | Kern et al. |
| 6,316,785 B1 * | 11/2001 | Nunoue ............... B82Y 20/00 257/103 |

(Continued)

FOREIGN PATENT DOCUMENTS

| JP | 11-224866 | 8/1999 |
| JP | 2000-031539 | 1/2000 |

(Continued)

OTHER PUBLICATIONS

Japanese Office Action for corresponding JP Application No. 2015-230186, dated Jan. 31, 2017 (w/ machine translation).

*Primary Examiner* — Evren Seven (74) *Attorney, Agent, or Firm* — Mori & Ward, LLP (57) ABSTRACT

A method of manufacturing a light emitting element includes providing a wafer having a substrate and a semiconductor layered body provided on an upper surface of the substrate, irradiating the substrate with laser light from a side of a lower surface opposite to the upper surface of the substrate to form modified regions in the substrate, and dividing the wafer into light emitting elements at the modified regions as a starting point. The semiconductor layered body includes a first p-type semiconductor layer made of a nitride semiconductor and provided on the upper surface of the substrate, an n-type semiconductor layer made of a nitride semiconductor and provided on the first p-type semiconductor layer, an active layer made of a nitride semiconductor and provided on the n-type semiconductor layer, and a second p-type semiconductor layer made of a nitride semiconductor and provided on the active layer.

28 Claims, 6 Drawing Sheets

(56) References Cited

U.S. PATENT DOCUMENTS

| | | | |
|---|---|---|---|
| 6,377,597 B1 * | 4/2002 | Okumura | B82Y 20/00 257/E33.008 |
| 6,462,354 B1 * | 10/2002 | Okuyama | H01L 33/32 257/103 |
| 9,450,150 B2 * | 9/2016 | Komada | H01L 33/025 |
| 2004/0051107 A1 * | 3/2004 | Nagahama | B82Y 20/00 257/79 |
| 2004/0124500 A1 * | 7/2004 | Kawagoe | H01L 33/32 257/548 |
| 2005/0186760 A1 * | 8/2005 | Hashimura | B23K 26/18 438/460 |
| 2006/0121697 A1 | 6/2006 | Fujii et al. | |
| 2006/0226434 A1 * | 10/2006 | Hata | H01L 33/32 257/94 |
| 2006/0273324 A1 * | 12/2006 | Asai | H01L 33/20 257/79 |
| 2008/0003708 A1 | 1/2008 | Hoshino et al. | |
| 2009/0321748 A1 * | 12/2009 | Lee | H01L 33/0095 257/79 |
| 2011/0204412 A1 * | 8/2011 | Sugano | H01L 33/0095 257/103 |
| 2011/0261849 A1 * | 10/2011 | Shinagawa | H01L 33/007 372/45.01 |
| 2012/0248459 A1 * | 10/2012 | Sakano | H01L 21/0237 257/76 |
| 2013/0234149 A1 * | 9/2013 | Halderman | H01L 33/32 257/76 |
| 2015/0155431 A1 * | 6/2015 | Tamemoto | H01L 33/007 438/29 |
| 2015/0349202 A1 * | 12/2015 | Yamamoto | H01L 33/02 257/98 |
| 2016/0284944 A1 * | 9/2016 | Narita | B23K 26/40 |

FOREIGN PATENT DOCUMENTS

| | | |
|---|---|---|
| JP | 2000-277803 | 10/2000 |
| JP | 2002-009341 | 1/2002 |
| JP | 2005-184032 | 7/2005 |
| JP | 2007-73569 | 3/2007 |
| JP | 2007-311371 | 11/2007 |
| JP | 5221007 B2 | 12/2007 |
| JP | 2008-006492 | 1/2008 |
| JP | 2010-103424 | 5/2010 |
| JP | 2011-181909 | 9/2011 |
| JP | 2012-28734 | 2/2012 |
| JP | 2012-142401 | 7/2012 |
| JP | 2013-42119 | 2/2013 |
| JP | 2013-098298 | 5/2013 |
| JP | 2013-235867 | 11/2013 |
| JP | 2015-088532 | 5/2015 |

* cited by examiner

FIG.3K

METHOD OF MANUFACTURING LIGHT EMITTING ELEMENT

CROSS-REFERENCE TO RELATED APPLICATIONS

The present application claims priority under 35 U.S.C. § 119 to Japanese Patent Application No. 2015-60500, filed Mar. 24, 2015, Japanese Patent Application No. 2015-79935, filed Apr. 9, 2015, and Japanese Patent Application No. 2015-230186, filed Nov. 26, 2015. The contents of these applications are incorporated herein by reference in their entireties.

BACKGROUND

Technical Field

The present disclosure relates to a method of manufacturing a light emitting element.

Discussion of the Background

A light emitting element having a nitride semiconductor such as a light emitting diode (LED) may be manufactured such that a plurality of elements are formed on a substrate such as sapphire or the like through a wafer process, and then singulating (dividing) the substrate into individual light emitting elements. For such singulation method, a method has been proposed in which a processing trace is formed by applying laser light with a converging point set inside the substrate, and a wafer is divided along the processing trace (see, for example, JP 2013-42119 A and JP 2011-181909 A).

SUMMARY OF THE INVENTION

According to one aspect of the present invention, a method of manufacturing a light emitting element includes providing a wafer having a substrate and a semiconductor layered body provided on an upper surface of the substrate, irradiating the substrate with laser light from a side of a lower surface opposite to the upper surface of the substrate to form modified regions in the substrate, and dividing the wafer into light emitting elements at the modified regions as a starting point. The semiconductor layered body includes a first p-type semiconductor layer made of a nitride semiconductor and provided on the upper surface of the substrate, an n-type semiconductor layer made of a nitride semiconductor and provided on the first p-type semiconductor layer, an n-side electrode connected to the n-type semiconductor layer, an active layer made of a nitride semiconductor and provided on the n-type semiconductor layer, a second p-type semiconductor layer made of a nitride semiconductor and provided on the active layer, and a p-side electrode connected to the second p-type semiconductor layer.

According to another aspect of the present invention, a method of manufacturing a light emitting element includes providing a wafer having a substrate and a semiconductor layered body provided on an upper surface of the substrate, and irradiating the substrate with laser light from a side of a lower surface opposite to the upper surface of the substrate to singulate the wafer into individual light emitting elements. The semiconductor layered body includes a first p-type semiconductor layer made of a nitride semiconductor and provided on the upper surface of the substrate, an n-type semiconductor layer made of a nitride semiconductor and provided on the first p-type semiconductor layer, an n-side electrode connected to the n-type semiconductor layer, an active layer made of a nitride semiconductor and provided on the n-type semiconductor layer, a second p-type semiconductor layer made of a nitride semiconductor and provided on the active layer, and a p-side electrode connected to the second p-type semiconductor layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

The embodiments will now be described with reference to the accompanying drawings, wherein like reference numerals designate corresponding or identical elements throughout the various drawings.

Hereinafter, a method of manufacturing a light emitting element according to various embodiments will be described with reference to the drawings. The sizes, positional relationships and so on of members shown in the drawings may be exaggerated for clarification of explanations. Further, in the following descriptions, the same names and symbols generally show the same or equivalent members, and detailed descriptions thereof are appropriately omitted.

EMBODIMENTS

Configuration of Light Emitting Element

Figure 1A:
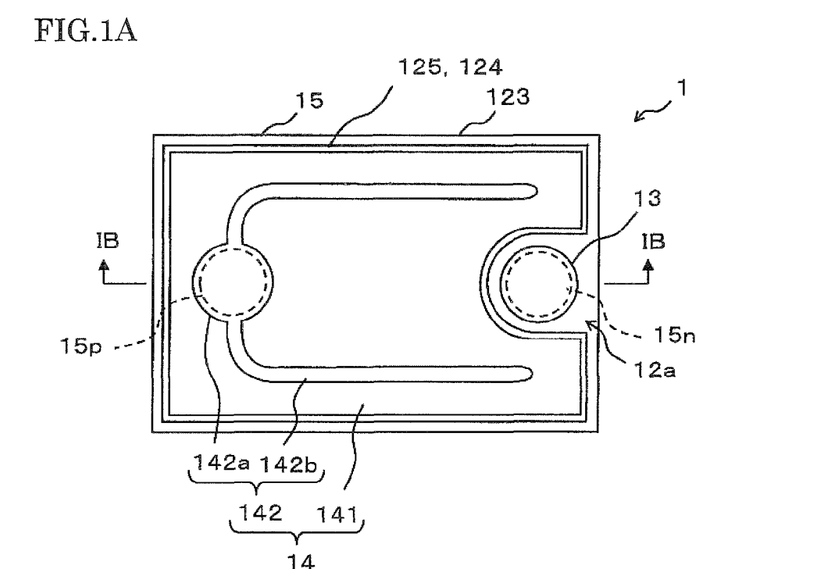
FIG. 1A is a schematic plan view showing a configuration of a light emitting element obtained by a method of manufacturing a light emitting element according to various embodiments.

A configuration of a light emitting element produced according to a method of manufacturing a light emitting element according to various embodiments will be described with reference to FIG. 1A and FIG. 1B.

A light emitting element 1 produced according to a method of manufacturing a light emitting element according to various embodiments includes a substrate 11, a semiconductor layered body 12 layered on the substrate 11, an n-side electrode 13 and a p-side electrode 14 that are a pair of electrodes electrically connected to the semiconductor layered body 12, and a protective film 15. The semiconductor layered body 12 includes a plurality of semiconductor layers each made of a nitride semiconductor, layered on a substrate 11 in order of a base layer 121, a first p-type semiconductor layer 122, an n-type semiconductor layer 123, an active layer 124 and a second p-type semiconductor layer 125, which are layered from the substrate 11 side. In some embodiments, the first p-type semiconductor layer 122 is a light-absorbing layer and the second p-type semiconductor layer 125 is a p-type semiconductor layer.

In the method of manufacturing a light emitting element according to various embodiments, a plurality of light emitting elements 1 are formed on one substrate 11 through a wafer process. Then, using a laser dicing method, in which a laser light is applied from the lower surface side of the substrate 11, the substrate 11 is cleaved to singulate the light-emitting elements 1.

In some embodiments, the semiconductor layered body 12 has an LED structure, in which the n-side electrode 13 and the p-side electrode 14 are connected to an external power source to supply electric power to the semiconductor layered body 12 so that the active layer 124 emits light. The semiconductor layered body 12 is not limited to one having a LED structure, and for example, an LD (laser diode) structure may be employed. The outer shape of the light emitting element 1, and the shapes and arrangement regions of the electrodes are shown for illustrative purposes, and other appropriate shapes can be employed. Hereinafter, the configurations of the members will be described one by one in detail.

The substrate 11 is a substrate for supporting the semiconductor layered body 12 and epitaxially growing (crystal-growing) the semiconductor. Examples of the substrate 11 suitable for growing the semiconductor layered body 12 include insulating substrates such as a sapphire with a principal plane of C-plane, R-plane, or A-plane, and a spinel (MgAl2O4); SiC, ZnS, ZnO, Si, GaAs, and diamond; and oxide substrates that lattice match with a nitride semiconductor such as lithium niobate and neodymium gallate. A plurality of projections may be formed on the principal surface of the substrate 11 on which crystal of the semiconductor layered body 12 to be grown. With this arrangement, crystal defects such as dislocations penetrating to the upper surface of the semiconductor layered body 12 can be reduced.

The semiconductor layered body 12 may include a base layer 121, a light absorbing layer 122, an n-type semiconductor layer 123 and a p-type semiconductor layer 125 layered on an upper surface, i.e., one principal surface, of the substrate 11, and is configured to emit light upon being supplied with a sufficient current between the n-side electrode 13 and the p-side electrode 14. As shown in FIG. 1B, preferably, the active layer 124 is provided between the n-type semiconductor layer 123 and the p-type semiconductor layer 125.

For the semiconductor layered body 12, nitride semiconductors suitable for the semiconductor light emitting element can be used. In the case of employing a fluorescent material layer to convert a portion of light emitted from the light emitting element 1 to light of different wavelength, the semiconductor layered body 12 that is configured to emit light of a short wavelength such as blue light or violet light is suitable. Accordingly, for each of the semiconductor layers of the semiconductor layered body 12, a nitride-based compound semiconductor represented by $In_XAl_YGa_{1-X-Y}N$ ($0 \leq X$, $0 \leq Y$, $X+Y \leq 1$) can be suitably used. The semiconductor layers of the semiconductor layered body 12 can be formed by using a known method such as, for example, a MOCVD method (metal organic chemical vapor deposition method), a HYPE method (hydride vapor phase epitaxy method), a MBE method (molecular beam epitaxy method) or a sputtering method. Each of the semiconductor layers can be formed with an appropriate thickness.

The semiconductor layered body 12 has a step portion 12a formed by removing a region of the semiconductor layered body 12 from its upper surface side, in which the p-type semiconductor layer 125 and the active layer 124 are entirely removed and the n-type semiconductor layer 123 is partially removed in the thickness direction. The bottom surface of the step portion 12a is made of the n-type semiconductor layer 123, and an n-side electrode 13 is disposed on the bottom surface of the step portion 12a. Meanwhile, a p-side electrode 14 includes a lower portion made of a whole surface electrode 141 that is disposed on an approximately entire upper surface of the p-type semiconductor layer 125. In addition to the region for disposing the n-side electrode 13, a step portion 12a is also formed in a region along the outer periphery of the semiconductor layered body 12. The step portion 12a at the outer periphery corresponds to a region (dicing street) of boundary lines (predetermined cleaving lines) that is an imaginary dividing line to singulate each individual light emitting element 1 from a wafer state. Other surfaces of the semiconductor layered body 12 are covered by the protective film 15 together with the n-side electrode 13 and the p-side electrode 14.

The base layer 121 is a semiconductor layer for improving the crystallinity of semiconductor layers used in a light emitting element that includes the n-type semiconductor layer 123, the active layer 124 and the p-type semiconductor layer 125. The base layer 121 has a layered structure having a buffer layer 121a and a first semiconductor layer 121b in this order from the substrate 11 side. Other than the two-layer structure, the layered structure of the base layer 121 may have a single layer structure, or a structure having three or more layers.

The buffer layer 121a is a layer for reducing a difference between the lattice constant of the substrate 11 and the lattice constant of a semiconductor layers above the buffer layer 121a. For the buffer layer 121a, it is preferable to use an undoped nitride semiconductor represented by $Al_XGa_{1-X}N$ (0<X≤1), and it is more preferable to use undoped AlGaN. The buffer layer 121a can be formed suitably by using a MOCVD method.

The buffer layer 121a preferably has a thickness in a range between about 5 nm to about 300 nm, where the buffer layer 121a with a thickness of about 5 nm or greater can sufficiently cover the whole upper surface of the substrate 11 and with a thickness of about 300 nm or less can improve the crystallinity of the light absorbing layer 122 layered on the upper surface of the buffer layer 121a, and a thickness in a range of about 10 nm to about 200 nm is more preferable.

The first semiconductor layer 121b is formed in contact with the upper surface of the buffer layer 121a. The first semiconductor layer 121b can be crystal-grown suitably by using a MOCVD method, and is formed with such a thickness so that very small recessed portions that occurred in the upper surface of the buffer layer 121a can be filled with the first semiconductor layer 121b in the process of crystal growth to obtain a substantially flat upper surface. The first semiconductor layer 121b is preferably made of an undoped nitride-based compound semiconductor represented by $In_XAl_YGa_{1-X-Y}N$ (0≤X, 0≤Y, X+Y≤1), and of those, undoped GaN is more preferably used. In the present embodiment, the term "undoped nitride-based compound semiconductor" refers to a semiconductor layer having a dopant concentration of $1 \times 10^{16}$ $cm^{-3}$ or less. The first semiconductor layer 121b has a thickness that allows the formation of a flat surface which may be in a range of about 500 nm to about 6000 nm.

The first semiconductor layer 121b may have a single-layer structure that is crystal-grown without changing the conditions, or may have a multilayer structure of two or more layers that are crystal-grown while changing the conditions.

The light absorbing layer (first p-type semiconductor layer) 122 is provided to reduce the intensity of laser light, which is applied to a portion of the semiconductor layer structure above the light absorbing layer 122, particularly to the p-type semiconductor layer 125, by absorbing laser light applied from the lower surface side of the substrate 11 at the time of cleaving the substrate 11 in a laser dicing method. The light absorbing layer 122 can be formed using a semiconductor material that can absorb laser light used in laser dicing, and that allows good crystal-growth of the n-type semiconductor layer 123 formed on the light absorbing layer 122. Such a semiconductor material may be preferably a nitride-based semiconductor doped with Mg that is a p-type dopant as used in the p-type semiconductor layer 125 to be described below. The composition of the semiconductor material is preferably GaN so that good crystallinity can be obtained continuously from the upper surface of the base layer 121. In order to obtain good light absorption and good crystallinity, the concentration of Mg that is a p-type dopant is preferably in a range of about $1 \times 10^{17}$ $cm^{-3}$ to about $1 \times 10^{21}$ $cm^{-3}$, more preferably in a range of about $1 \times 10^{18}$ $cm^{-3}$ to about $1 \times 10^{21}$ $cm^{-3}$, and further preferably in a range of about $1 \times 10^{19}$ $cm^{-3}$ to about $5 \times 10^{20}$ $cm^{-3}$. In the present embodiment, the light absorbing layer 122 is a nitride semiconductor layer containing a p-type dopant that is typically activated by dehydrogenation of a nitride semiconductor layer containing a p-type dopant through an annealing treatment. From the fact that a nitride semiconductor layer containing a p-type dopant before subjected to an annealing treatment receives less damage, while a nitride semiconductor layer containing a p-type dopant subjected to an annealing treatment becomes more prone to damage by laser dicing the present inventors have considered that absorption of laser light may be induced in the activated p-type dopant (dopant) and at an energy density of equal to or greater than a certain value, portions of the p-type nitride semiconductor layer with weak crystal structure may be damaged.

The light absorbing layer 122 preferably has a thickness of 10 nm or more that allows absorption of laser light used in laser dicing can be absorbed to a certain degree so as that the p-type semiconductor layer 125 is not damaged by the laser light. Also, the light absorbing layer 122 preferably has a thickness of 1000 nm or less so that the n-type semiconductor layer 123 formed on the light absorbing layer 122 can be grown with good crystallinity.

The light absorbing layer 122 can be provided above the substrate 11 and below the n-type semiconductor layer 123 of the semiconductor layered body 12. In the case where the n-type semiconductor layer 123 has a multilayer structure of layers of an n-type contact layer, a n-side clad layer and so on, the light absorbing layer 122 can be provided above the substrate 11 and below the n-type contact layer. In order to form the semiconductor layered body 12 with good crystallinity, the light absorbing layer 122 is preferably formed above the buffer layer 121a, and more preferably, formed above the first semiconductor layer 121b whose upper surface may be is a mirror surface-like flat surface. At least one layer of the base layer 121 may be doped with Mg so that the base layer 121 also serves as the light absorbing layer 122.

In order to form the n-type semiconductor layer 123 with good crystallinity, a second semiconductor layer may be provided in contact with the upper surface of the light absorbing layer 122, that is, between the light absorbing layer 122 and the n-type semiconductor layer 123. The second semiconductor layer is preferably a layer formed of an undoped nitride-based compound semiconductor represented by $In_XAl_YGa_{1-X-Y}N$ (0≤X, 0≤Y, X+Y≤1), more preferably a layer formed of undoped GaN.

The layered structure including the n-type semiconductor layer 123, the active layer 124 and the p-type semiconductor layer 125 is a light emitting structure formed on the upper surface of the light absorbing layer 123, and in the present embodiment, has a nitride-based semiconductor light emitting diode structure. Those semiconductor layers are typically formed successively after the formation of the light absorbing layer 122, in which a MOCVD method is suitably used. For those semiconductor layers, nitride semiconductors represented by $In_XAl_YGa_{1-X-Y}N$ (0≤X, 0≤Y, X+Y≤1) can be suitably used.

The n-type semiconductor layer 123 is made of crystals of semiconductor that is a nitride semiconductor of aforementioned composition doped with an n-type dopant such as Si, Ge or Sn, preferably doped with Si. The n-type semiconductor layer 123 may have a layered structure including an n-type contact layer to which an n-side electrode 13 is disposed, an n-side clad layer that is a layer for injecting or confining carriers to the active layer 124, and so on.

The n-type dopant concentration of the n-type semiconductor layer 123 is preferably in a range of about $1 \times 10^{17}$ $cm^{-3}$ to about $1 \times 10^{20}$ $cm^{-3}$, more preferably in a range of about $1 \times 10^{18}$ $cm^{-3}$ to about $1 \times 10^{19}$ $cm^{-3}$. The n-type semiconductor layer 123 has an appropriate thickness preferably in a range of about 0.5 μm to about 10 μm, more preferably in a range of about 1 μm to 8 μm, that allows maintaining of good crystallinity of the semiconductor.

The active layer 124 is provided between the n-type semiconductor layer 123 and the p-type semiconductor layer 125, and is configured to emit light as carriers supplied from those semiconductor layers are combined in the active layer 124. The active layer 124 has a single quantum well structure or a multiple quantum well structure in which thin layers that can produce quantum effect are layered. For example, the multiple quantum well structure may include a well layer made of $In_xGa_{1-x}N$ (0<X<0.4) and a barrier layer made of $Al_xGa_{1-x}N$ (0≤X<0.3) having a band gap energy larger than that of the well layer. The well layer has a thickness that allows producing quantum effect, and for example, a thickness may be in a range of about 1 nm to 10 nm, preferably in a range of about 2 nm to about 6 nm. The barrier layer has an appropriate thickness corresponding to the thickness of the well layer.

The p-type semiconductor layer (second p-type semiconductor layer) 125 is made of crystals of a semiconductor in which a nitride semiconductor having the aforementioned composition is doped with a p-type dopant such as Mg. The p-type semiconductor layer 125 may have a layered structure including a p-type contact layer to which a p-side electrode 14 is disposed, a p-side clad layer that is a layer for injecting or confining carriers to the active layer 124, and so on.

In order to obtain sufficient ohmic contact with the whole surface electrode 141 and sufficient crystallinity, the p-type dopant concentration of the p-type semiconductor layer 125 is preferably in a range of about $1 \times 10^{18}$ $cm^{-3}$ to about $1 \times 10^{21}$ $cm^{-3}$, more preferably in a range of about $5 \times 10^{19}$ $cm^{-3}$ to about $5 \times 10^{20}$ $cm^{-3}$. The p-type semiconductor layer 125 has an appropriate thickness, in order to obtain high light emitting output, a thickness in a range of about 10 nm to about 500 nm is preferable, and in a range of about 50 nm to 200 nm is more preferable.

The n-side electrode 13 is electrically connected to the n-type semiconductor layer 123 at the bottom surface of the step portion 12a of the semiconductor layered body 12, and serves as a pad electrode for supplying an external electric current from the outside to the light emitting element 1. For the n-side electrode 13, for example, a single metal such as Ag, Al, Ni, Rh, Au, Cu, Ti, Pt, Pd, Mo, Cr or W, or an alloy mainly composed of any of these metals can be used for making the n-side electrode 13 suitable for connecting to the outside by wire bonding, and these metal layers can be used in the form of a single-layer or a multi-layer. In the case of using an alloy for the n-side electrode 13, the alloy may be for example an Al—Si—Cu alloy that contains a nonmetallic element such as Si as a composition element. Also, the n-side electrode 13 is covered by the protective film 15 except for a predetermined region of the upper surface for connection to the outside.

The p-side electrode 14 is an electrode made of the whole surface electrode 141 and a pad electrode 142, and is electrically connected to the p-type semiconductor layer 125 of the semiconductor layered body 12, and serves to supply an electric current from the outside to the light emitting element 1. The p-side electrode 14 is covered with the protective film 15 except for a predetermined region of the upper surface of the pad electrode 142 for connection to the outside.

The whole surface electrode 141 covers an approximately an entire upper surface of the p-type semiconductor layer 125 and serves as a current diffusing layer for diffusing the electric current that is supplied from the outside via the pad electrode 142 to the entire surface of the p-type semiconductor layer 125. In the case where the light emitting element 1 is of a face-up type, the light emitted by the semiconductor layered body 12 is extracted to the outside through the whole surface electrode 141. Accordingly, it is preferable that the whole surface electrode 141 has good light transmissivity to the wavelength of light emitted by the semiconductor layered body 12, and for example, an electrically conductive metal oxide such as ZnO, $In_2O_3$ or ITO ($In_2O_3$ doped with Sn) can be used. Of those, ITO can be suitably used because it is a material having high light transmissivity to visible light and a high electrical conductivity. Meanwhile, in the case where the light emitting element 1 is of a face-down type (a flip-chip type), light emitted by the semiconductor layered body 12 is extracted to the outside through the substrate 11. Accordingly, the whole surface electrode 141 preferably has good light reflectivity to the wavelength of light emitted by the semiconductor layered body 12, and as a metal material with good light reflectivity particularly to visible light, for example, Ag, Al, or an alloy mainly made of any of these metals can be suitably used.

The pad electrode 142 is to supply a current from the outside to the light emitting element 1, and is disposed on a portion of the upper surface of the whole surface electrode 141. The pad electrode 142 is electrically connected to the p-type semiconductor layer 125 through the whole surface electrode 141, and the pad electrode 142 is formed in an approximately circular shape in a plan view, and has an external connection portion 142a that is a region for connecting to the outside, and an extending portion 142b arranged extending from the external connection portion 142a to the n-side electrode 13 side along the outer edge of the p-type semiconductor layer 125.

The extending portion 142b is provided for more evenly diffusing the current to the whole surface electrode 141 in the case where the light emitting element 1 is of a face-up type and the whole surface electrode 141 has light transmissivity. In the case where the light emitting element 1 is of a face-down type and the whole surface electrode 141 is formed of a metal material having good conductivity and light reflectivity, it is not necessary to provide the extending portion 142b. For the pad electrode 142, a material similar to that used for the n-side electrode 13 can be used.

The protective film 15 has light transmissivity and insulation property, and covers the semiconductor layered body 12, the n-side electrode 13 and the p-side electrode 14. The protective film 15 has an opening 15n on the upper surface of the n-side electrode 13, and an opening 15p on the upper surface of the external connection portion 142a of the pad electrode 142 of the p-side electrode 14. For the protective film 15, for example, an oxide such as $SiO_2$, $TiO_2$ or $Al_2O_3$, a nitride such as SiN, or fluoride such as $MgF_2$ can be suitably used.

Operations of Light Emitting Element

Operations of the light emitting element 1 will be described below with reference to FIG. 1A and FIG. 1B. In the light emitting element 1, when an external power source is connected between the n-side electrode 13 and the p-side electrode 14, a current is supplied between the n-type semiconductor layer 123 and the p-type semiconductor layer 125 to cause the active layer 124 to emit light. In the case where the light emitting element 1 is of a face-up type, light generated in the active layer 124 of the light emitting element 1 propagates in the semiconductor layered body 12 and is extracted to the outside mainly from the upper surface of the light emitting element 1. In the case where the light emitting element 1 is of a face-down type, light generated in the active layer 124 of the light emitting element 1 propagates in the semiconductor layered body 12 and is extracted to the outside mainly from the lower surface of the light emitting element 1.

Method of Manufacturing Light Emitting Element

Figure 2:
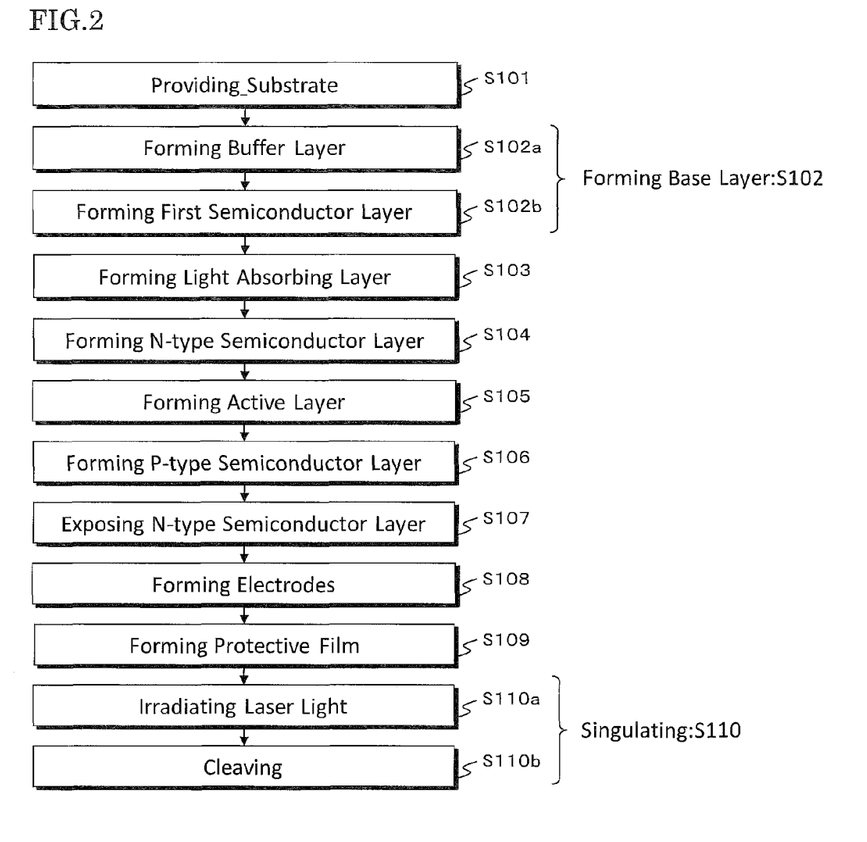
FIG. 2 is a flow chart showing a procedure of a method of manufacturing a light emitting element according to various embodiments.
Figure 3A:
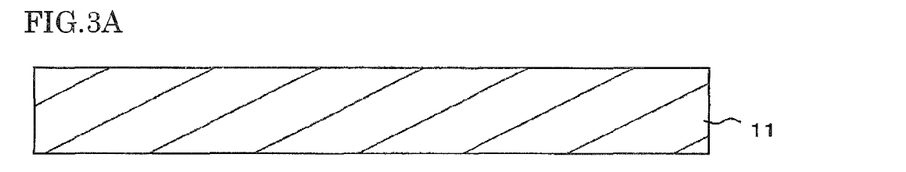
FIG. 3A is a schematic sectional view illustrating providing a substrate in a method of manufacturing a light emitting element according to various embodiments.
Figure 3B:
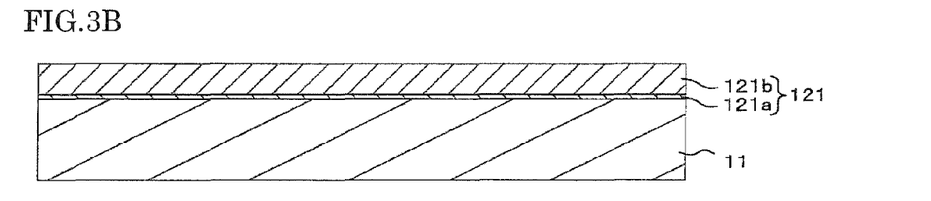
FIG. 3B is a schematic sectional view illustrating forming a base layer in a method of manufacturing a light emitting element according to various embodiments.
Figure 3C:
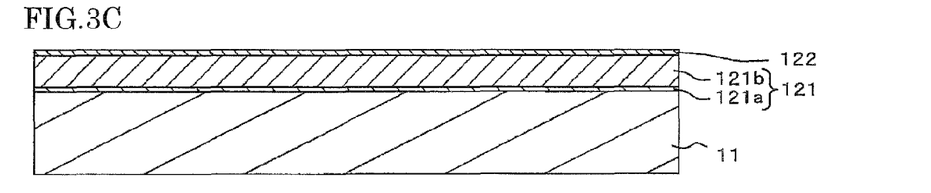
FIG. 3C is a schematic sectional view illustrating forming a light absorbing layer in a method of manufacturing a light emitting element according to various embodiments.
Figure 3D:
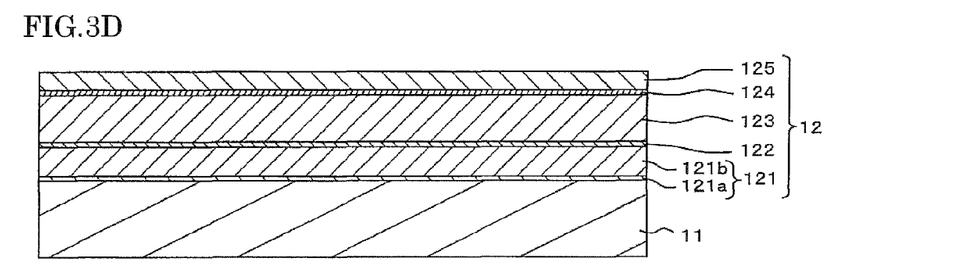
FIG. 3D is a schematic sectional view illustrating forming an n-type semiconductor layer, forming an active layer and forming a p-type semiconductor layer in a method of manufacturing a light emitting element according to various embodiments.
Figure 3E:
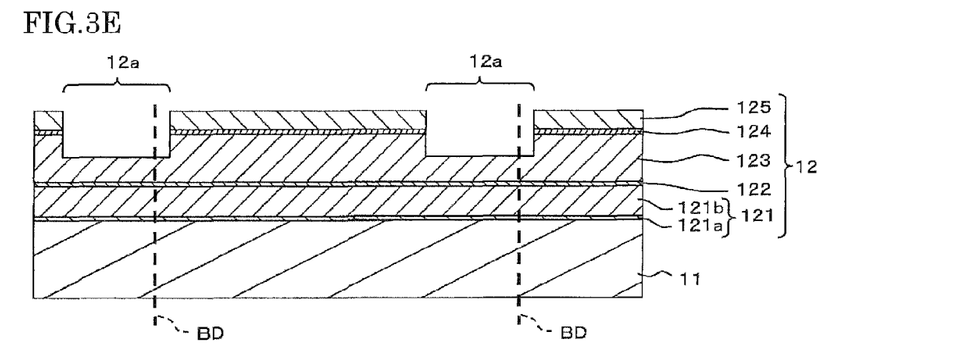
FIG. 3E is a schematic sectional view illustrating exposing an n-type semiconductor layer in a method of manufacturing a light emitting element according to various embodiments.
Figure 3F:
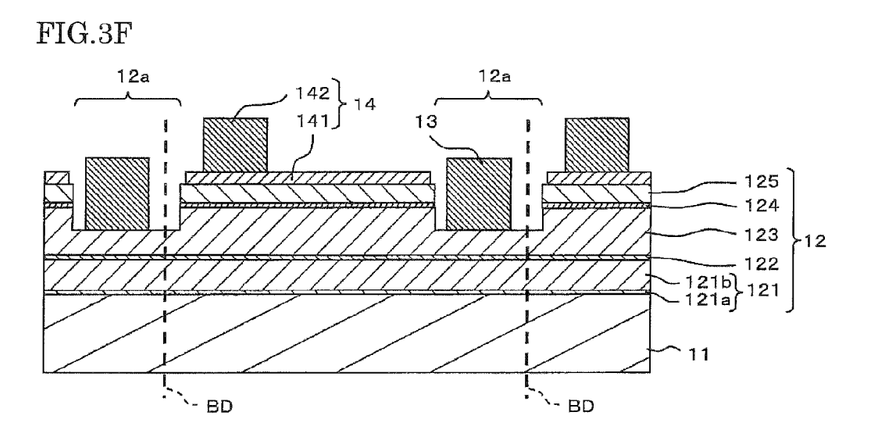
FIG. 3F is a schematic sectional view illustrating forming electrodes in a method of manufacturing a light emitting element according to various embodiments.
Figure 3G:
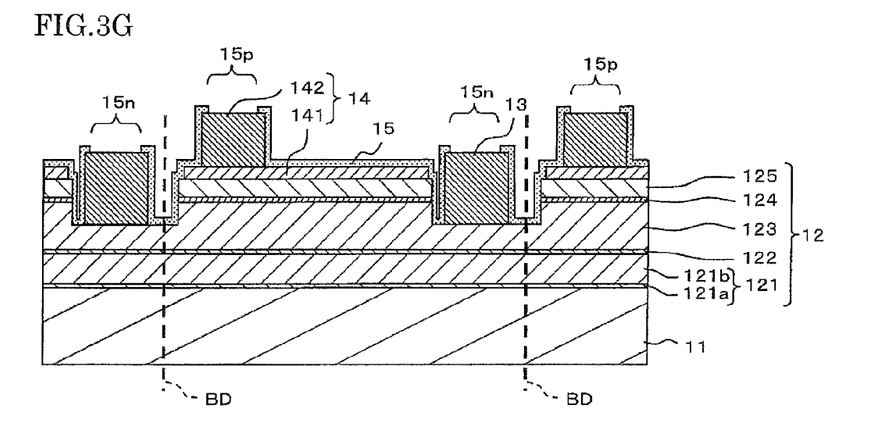
FIG. 3G is a schematic sectional view illustrating forming a protective film in a method of manufacturing a light emitting element according to various embodiments.
Figure 3H:
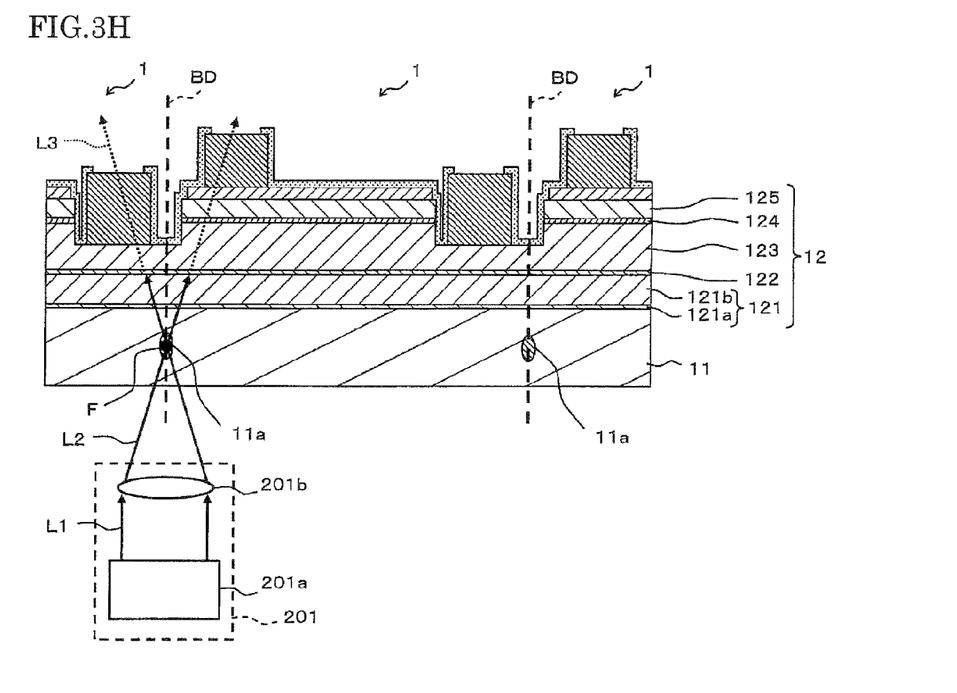
FIG. 3H is a schematic sectional view illustrating irradiating a laser light in a step of singulating in a method of manufacturing a light emitting element according to various embodiments.
Figure 3I:
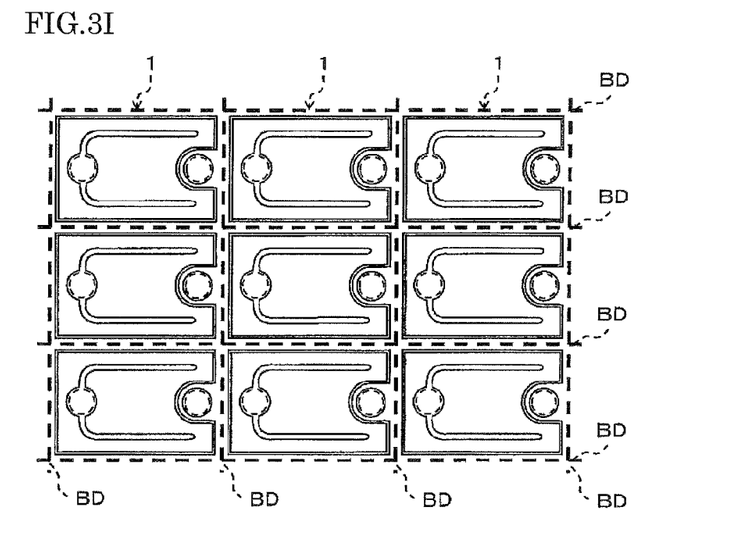
FIG. 3I is a schematic plan view showing a wafer before singulating in a method of manufacturing a light emitting element according to various embodiments.

A method of manufacturing a light emitting element according to the present embodiment will be described below with reference to FIGS. 2 to 3I.

The method of manufacturing a light emitting element according to the present embodiment includes steps of providing a substrate S101, forming a base layer S102, forming a light absorbing layer S103, forming an n-type semiconductor layer S104, forming an active layer S105, forming a p-type semiconductor layer S106, exposing the n-type semiconductor layer S107, forming electrodes S108, forming a protective film S109, and singulating S110.

First, in the step of providing a substrate S101, a substrate 11 for supporting and crystal-growing the semiconductor layered body 12 is provided. For the substrate 11, a sapphire substrate with a C-surface as a main surface for crystal-growing the semiconductor layered body 12 can be used suitably. A plurality of recessed portions may be formed on the main surface of the substrate 11 by an etching method etc. so that crystal defects such as displacements in crystal growth of the semiconductor layered body 12 can be reduced.

Next, in the step of forming base layer S102, the base layer 121 is formed so as to obtain good crystallinity in the layers particularly above the n-type semiconductor layer 123 that form a light emitting structure. The step of forming base layer S102 includes forming buffer layer S102a and forming first semiconductor layer S102b.

In the step of forming the buffer layer S102a, the buffer layer 121a is formed on the substrate 11 using the materials described above. The buffer layer 121a is formed on the substrate 11 by, for example, using a MOCVD method or a sputtering method, more preferably a MOCVD method.

More specifically, in the case of using a MOCVD method, in order to form the buffer layer 121a, as for Group III elements, trimethyl aluminum (TMA) can be used as a raw material of Al, trimethyl gallium (TMG) can be used as a raw material of Ga, and trimethyl indium (TMI) can be used as a raw material of In. As for Group V element, an ammonia ($NH_3$) can be used as a source gas of N. A semiconductor layer having a desired composition can be formed by adjusting the ratio of the supply amounts of these raw material gases. As for a carrier gas for supplying those raw materials, for example, $H_2$, $N_2$ or a mixed gas thereof can be used.

In addition to the formation of the buffer layer 121a, a MOCVD method can also be suitably used for formation of semiconductor layers such as the other layer of the base material 121, the light absorbing layer 122, the n-type semiconductor layer 123, the active layer 124 and the p-type semiconductor layer 125. In such a MOCVD method, for a raw material of Si that is an n-type dopant, for example, silane ($SiH_4$) can be used, and for a raw material of Mg that is a p-type dopant, for example, bis (cyclopentadienyl) magnesium ($Cp_2Mg$) can be used.

In the step of forming a first semiconductor layer S102b, the first semiconductor layer 121b is formed on the buffer layer 121a. The first semiconductor layer 121b is an uppermost layer of the base layer 121 and is formed so that the upper surface of the first semiconductor layer 121b is preferably a mirror surface-shaped flat surface.

Next, in the step of forming the light absorbing layer S103, the light absorbing layer 122 is formed on the first semiconductor layer 121b. The light absorbing layer 122 is formed using a semiconductor having a composition described above and doped with a p-type dopant, preferably Mg. The light absorbing layer 122 is formed with a thickness and a concentration of p-type dopant so that in the step of singulating S110 to be described below, sufficient absorption of laser light applied from the lower surface side of the substrate 11 can be obtained so that the p-type semiconductor layer 125 is not damaged by the laser light.

Next, in the step of forming the n-type semiconductor layer S104, the n-type semiconductor layer 123 is formed on the light absorbing layer 122, and in the step of forming the active layer S105, the active layer 124 is formed on the n-type semiconductor layer 123, and in the step of forming the p-type semiconductor layer S106, the p-type semiconductor layer 125 is formed on the active layer 124. In the case where those semiconductor layers each has a multilayer structure such as the n-type contact layer, the n-side clad layer, the p-side clad layer, and the p-type contact layer, each of the semiconductor layers can be formed with a composition and doping concentration of dopant suitable for each layer is changed, so that a layered body having a light emitting element structure can be formed. It is preferable that after forming the semiconductor layered structure, an annealing treatment is performed to form the p-type semiconductor layer 125 and the light absorbing layer 122 of p-type.

Next, in the step of exposing the n-type semiconductor S107, etching is carried out from the upper surface of the semiconductor layered structure 12 to form step portions 12a that provide a region for disposing the n-side electrode 13 and a region of dicing streets that is a region with a predetermined width extending along boundary lines BD that are imaginary lines indicating the outer edges of the light emitting elements 1. The step portions 12a are formed with a depth to expose the n-type semiconductor layer 123. In the case where the n-type semiconductor layer 123 has a multilayer structure including an n-type contact layer, the step portions 12a are formed to a depth that the n-type contact layer is exposed. The p-type semiconductor layer 125, the active layer 124 and the n-type semiconductor layer 123 are partially exposed at the lateral side surfaces of the step portions 12a. For etching of the semiconductor layered body 12, a dry etching method such as RIE (reactive ion etching) can be suitably used, but a wet etching method can also be used.

Next, in the step of forming the electrodes S108, the n-side electrode 13 is formed on the n-type semiconductor layer 123 that is exposed to the bottom surface of the step portion 12a, and the p-side electrode 14 is formed on the p-type semiconductor layer 125. In the step of forming the electrodes S108, the whole surface electrode 141 is formed so as to cover approximately the whole region of the upper surface of the p-type semiconductor layer 125 by using a sputtering method or a vapor deposition method. Then, the pad electrode 142 is formed on a portion of the upper surface of the whole surface electrode 141 by using a sputtering method or a vapor deposition method. Also, the n-side electrode 13 is formed on the bottom surface of the step portion 12a by using a sputtering method or a vapor deposition method. In the case where the pad electrode 142 and the n-side electrode 13 are formed using the same material, the pad electrode 142 and the n-side electrode 13 may be formed in the same operational step.

Patterning of the n-side electrode 13, the whole surface electrode 141 and the pad electrode 142 can be carried out by using a photolithography method, in which a mask covering arrangement regions of each of those electrodes is formed, and performing etching after forming a film over the whole surface of a wafer using a material for forming each of these electrodes. Alternatively, patterning of those electrodes can be carried out by using a lift-off method, in which after disposing a mask having openings corresponding to arrangement regions of each of those electrodes, a film is formed over the whole surface of a wafer using a material for forming each of these electrodes, and then the mask is removed. Also, the protective film 15 to be described below can be patterned by using a similar method.

Next, in the step of forming the protective film S109, the protective film 15 is formed to cover approximately the whole surface of a wafer by using a sputtering method, a vapor deposition method or the like. The protective film 15 is patterned so that openings 15n and 15p are formed corresponding to the regions of the n-side electrode 13 and the pad electrode 142 to be connected to the outside.

The step of forming the electrodes S108 may be carried out such that the whole surface electrode 141 is formed and the protective film 15 is formed with openings on portions of the upper surface of the whole surface electrode 141 and portions of the bottom surface of the step portion 12a, then, the pad electrode 142 and the n-side electrode 13 are formed. At this time, the pad electrode 142 and the n-side electrode 13 may be formed extending to the upper surface of the protective film 15. As described above, a wafer can be provided with the operational steps of providing the substrate S101 to forming the protective film S109.

Next, in the step of singulating S110, the wafer is divided along the boundary lines BD that are predetermined cleaving lines by using a laser dicing method, to obtain individual light emitting elements 1. The step of singulating S110 includes irradiating laser light S110a and separating S110b.

First, in the step of irradiating laser light (step of forming a modified region) S110a, laser light L2 is applied along the boundary lines BD from the lower surface side of the substrate 11 using a laser light irradiation device 201 in such a manner that light is condensed inside the substrate 11. Thus, modified regions 11 are formed in the substrate 11 near the light condensing points F. The substrate 11 can be easily divided with the modified regions 11a as starting points. Each of the modified regions 11a may be formed on a portion of the substrate 11 in the thickness direction, but the modified regions 11a with a large width in the thickness direction may also be formed by applying laser light a plurality of times while changing the light condensing point F in the thickness direction. Accordingly, the wafer can be more easily divided.

Laser light L2 that is applied from the lower surface side of the substrate 11 is used for modifying the substrate 11 at and near the light condensing point F set inside the substrate 11, but a portion of laser light L2 may pass through the substrate 11 and enter the semiconductor layered body 12 from the lower surface, and further propagate upward. The laser light entering from the lower surface of the semiconductor surface of the semiconductor layered body 12 can be absorbed in the light absorbing layer 122 that is made of a p-type semiconductor. Accordingly, the intensity of laser light L3 passing through the light absorbing layer 122 and further propagating upward may be reduced.

The p-type semiconductor layer 125 is more easily damaged by absorbing laser light L3 as compared to other semiconductor layers of the semiconductor layered body 12. Particularly, in the case where the p-type semiconductor layer 125 near the region etched for forming the step portion 12a is damaged by etching, the p-type semiconductor layer 125 is more easily damaged by absorbing laser light L3. When the p-type semiconductor layer 125 is damaged, the electric characteristics of the light emitting element 1 are degraded. In the present embodiment, the light absorbing layer 122 is provided between the substrate 11 and the n-type semiconductor layer 123, and thus the intensity of laser light L3 applied to the p-type semiconductor layer 125 can be reduced. Accordingly, damage of the p-type semiconductor layer 125 by laser light L3 can be reduced. As a result, degradation in the electric characteristics of the light emitting element 1 can be reduced.

In addition, using as the light absorbing layer 122a, a semiconductor layer having a composition same or similar to that of the p-type semiconductor layer 125 of the semiconductor layered body 12, a layered body having a light emitting structure that is layered above the light absorbing layer 122 can be formed with good crystallinity.

The laser light irradiating device 201 may include a light source unit 201a and a light condensing unit 201b such as a light condensing lens. The laser light irradiation device 201 is configured such that alight condensing unit 201b condenses laser light L1 emitted from a light source unit 201a, so that laser light L2 is emitted to be condensed to a light-condensing point F. The laser light irradiation device 201 is also configured such that the light condensing point F of laser light L2 can be moved in any direction of the plane of the wafer by moving the laser light irradiation device relatively to the wafer.

The laser light used for laser dicing is preferably pulse laser such as femtosecond laser light, picosecond laser light or nanosecond laser light, in which, femtosecond laser light is particularly preferable, with a central wavelength in a range of 500 nm to 1100 nm, preferably in a range of 700 nm to 1000 nm. Examples of the light source unit 201a that emits such laser light include Nd:YAG (yttrium-aluminum-garnet) lasers, NdYVO$_4$ lasers, Nd:YLF (yttrium-lithium-fluoride) lasers and titanium sapphire lasers.

Figure 3J:
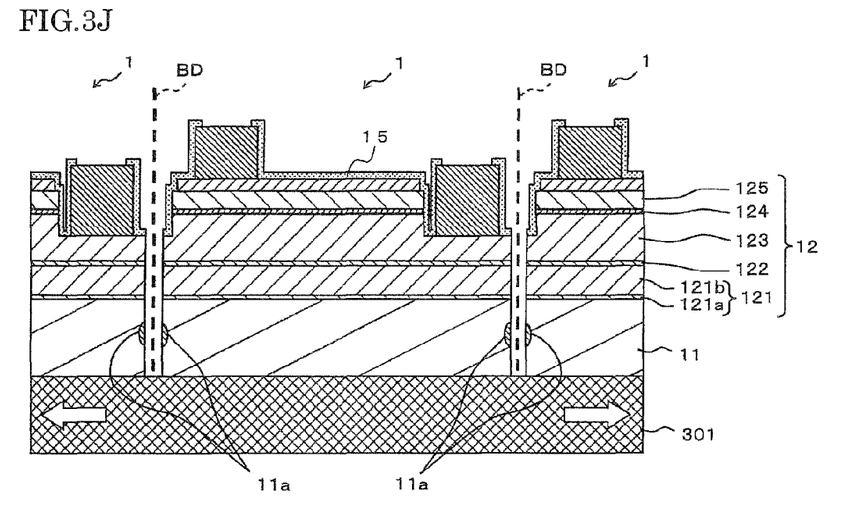
FIG. 3J is a schematic sectional view illustrating separating in a step of singulating in a method of manufacturing a light emitting element according to various embodiments.
Figure 3K:
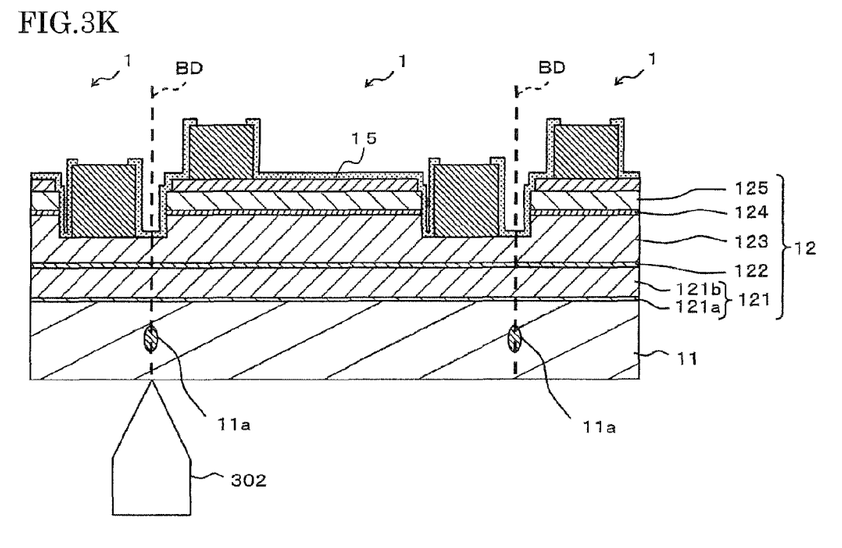
FIG. 3K is a schematic sectional view illustrating another example of separating in a step of singulating in a method of manufacturing a light emitting element according to various embodiments.

Next, in the step of dividing S110b, individual light emitting elements 1 are obtained by dividing (cleaving) the wafer along the boundary lines BD with using the modified regions 11a formed in the step of laser light irradiating S110a as starting points of dividing. The step of dividing S110b can be carried out by using a method that employs an expandable sheet 301 or a method that employs a blade 302.

The method that employs an expandable sheet 301 (see FIG. 3J) includes attaching the expandable sheet 301 to the lower surface side of the substrate 11 that has been subjected to the step of laser light irradiating, and extending the expandable sheet 301. Accordingly, together with the substrate 11, the semiconductor layered body 12 and the protective film 15 that are stacked on the substrate 11 can be divided into individual light emitting elements 1 with using the modified regions 11a formed along the boundary lines BD as starting points of cleaving.

Meanwhile, the method that employs a blade 302 (see FIG. 3K) includes pressing the knife edge of the blade 302 along the boundary line BD from the lower surface side of the substrate 11. Accordingly, together with the substrate 11, the semiconductor layered body 12 and the protective film 15 that are stacked on the substrate 11 can be divided into individual light emitting elements 1 with using the modified regions 11a as starting points of cleaving. A protective sheet may be attached to the upper surface side of the wafer before the blade 302 is pressed from the lower surface side of the substrate 11.

An increase in the output of laser light facilitates the cleaving, and singulating can be performed without carrying out a step of breaking, but with an excessive intensity of the output of the laser light, the semiconductor layered body 12 may be easily damaged, resulting in a degradation of the electrical properties. According to the present embodiment, laser light directed toward the semiconductor layered body 12 can be suitably absorbed by the light absorbing layer 122, so that damage of the semiconductor layered body 12 caused by the laser light can be reduced. Thus, singulating of the wafer can be performed without carrying out a step of breaking.

The light emitting element 1 can be manufactured with the operational steps as described above.

Experiment: Conformation of Reduction in Degradation of Electrical Characteristics In order to confirm the effect of the method of manufacturing a light emitting element according to the present embodiment, light emitting elements of Example 1, 2 according to the present embodiment that are provided with a light absorbing layer, and a light emitting element of Comparative Example that is not provided with a light absorbing layer were prepared, and the difference in the ratio of leakage occurrence as degradation of electric characteristics caused by laser light irradiation in the step of irradiating laser light was examined. In the experiment, proves were brought into contact with the respective electrodes of each individual light emitting elements formed on each wafer to determine occurrence of leakage before and after the laser light irradiation, and the ratio of light emitting elements in which the leakage occurred only after the laser irradiation was calculated.

The light emitting elements provided with a light absorbing layer of Examples 1, 2 were prepared with changing the layered location and the thickness of the light absorbing layer, and the flow rate of Mg as a p-type dopant, as described below. Unless otherwise specified, other conditions in preparation of the light emitting element are the same in Examples 1, 2 and Comparative Example.

Figure 1B:
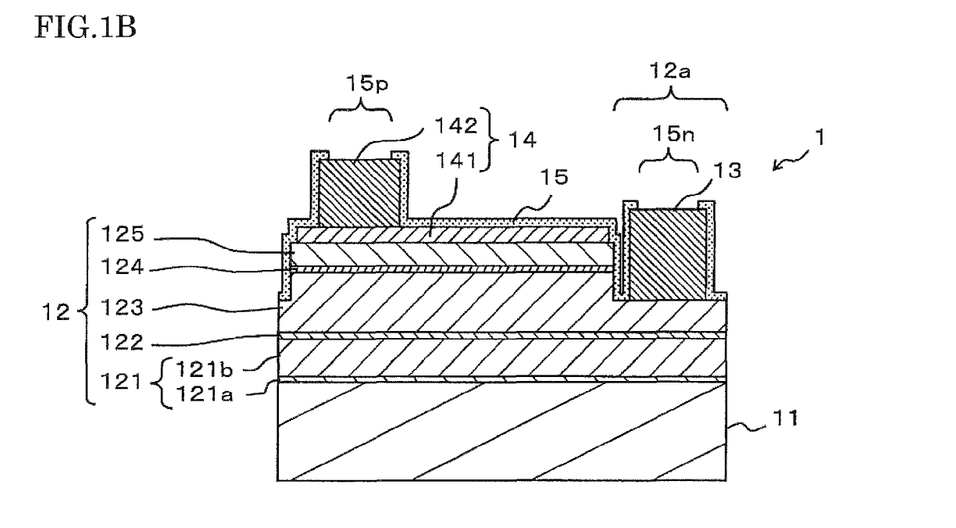
FIG. 1B is a schematic sectional view showing a configuration of a light emitting element obtained by a method of manufacturing a light emitting element according to various embodiments, where a cross-section taken along line IB-IB in FIG. 1A is shown.

The layered structure of the semiconductor layered body was approximately same to the layered structure shown in FIG. 1B except that an undoped second semiconductor layer was formed between the light absorbing layer and the n-type semiconductor layer. The semiconductor composition and the thickness of each layer are shown below.

Configuration of Substrate and Semiconductor Layered structure
Substrate: sapphire (main surface: C-surface), 150 μm
Buffer layer: AlGaN, 18 nm
First semiconductor layer: GaN, 3000 nm
Light absorbing layer: GaN (doped with Mg), 200 nm
Second semiconductor layer: GaN, 4800 nm
n-type semiconductor layer: GaN (doped with Si), 5000 nm
Active layer: InGaN/GaN in total thickness of 60 nm
p-type semiconductor layer: AlGaN (doped with Mg), 150 nm
Conditions for Formation of Light Absorbing Layer
Thickness of light absorbing layer: 0 nm (comparative example), 200 nm (Examples 1 and 2)
Mg flow rate: 10 cm$^3$/minute (Example 1), 100 cm$^3$/minute (Example 2)

The ratio of leakage occurrence caused by laser light irradiation in the light emitting elements prepared under each condition will be shown below. The semiconductor layered bodies of the light emitting elements of Comparative Example and Examples 1 and 2 were prepared by using different manufacturing apparatuses.

(Leakage Occurrence Ratio)
Comparative Example (no light absorbing layer): 4.5%
Example 1 (thickness: 200 nm, Mg flow rate: 10 cm$^3$/minute, Mg concentration: $1.02 \times 10^{19}$ cm$^{-3}$): 3.5%
Example 2 (thickness: 200 nm, Mg flow rate: 100 cm$^3$/minute, Mg concentration: $3.37 \times 10^{19}$ cm$^{-3}$): 1.0%

From the result of examining the samples in this experiment illustrated above, it has been confirmed that with the same thickness of the light absorbing layers, the leakage occurrence ratio can be reduced with an increase in the dopant concentration in the light absorbing layer by increasing the Mg flow rate in formation of the light absorbing layer.

As described above, it has been confirmed that with the presence of the light absorbing layer, the ratio of leakage occurrence caused by the laser light irradiation can be reduced, that is, degradation of the electric characteristics of the light emitting element can be reduced.

The method of manufacturing a light emitting element according to the embodiment of the present invention has been described with the mode for carrying out the invention, but the present invention is not limited to the descriptions thereof, and must be broadly construed on the basis of the descriptions of claims. It is needless to say that various changes, modifications and the like made on the basis of the descriptions thereof are included in the spirit of the present invention.

Light emitting elements manufactured by using the method of manufacturing a light emitting element according to the embodiment of the present disclosure can be used in backlight light sources of liquid crystal displays, and various light sources of various kinds of lighting fixtures, large displays, various kinds of display devices for advertisements, destination signs and the like, image reading apparatuses in digital video cameras, facsimile machines, copiers and scanners, and projector apparatuses.

Obviously, numerous modifications and variations of the present invention are possible in light of the above teachings. It is therefore to be understood that within the scope of the appended claims, the invention may be practiced otherwise than as specifically described herein.

What is claimed is:

1. A method of manufacturing a light emitting element, comprising:
    providing a wafer including a substrate;
    forming a semiconductor layered body on an upper surface of the substrate by:
        forming a buffer layer of a nitride semiconductor on an upper surface of the substrate opposite to a lower surface of the substrate;
        forming a first n-type semiconductor layer of an undoped nitride semiconductor on the buffer layer formed on the substrate;
        forming a first p-type semiconductor layer of a nitride semiconductor on the first n-type semiconductor layer formed on the buffer layer;
        forming the first p-type semiconductor layer with a flat upper surface;
        forming a second n-type semiconductor layer of a nitride semiconductor on the flat upper surface of the first p-type semiconductor layer formed on the first n-type semiconductor layer;
        connecting an n-side electrode to the second n-type semiconductor layer;
        forming an active layer of a nitride semiconductor on the second n-type semiconductor layer formed on the first p-type semiconductor layer;
        forming a second p-type semiconductor layer of a nitride semiconductor on the active layer formed on the second n-type semiconductor layer; and
        connecting a p-side electrode to the second p-type semiconductor layer;

irradiating the substrate with laser light from a side of the lower surface of the substrate to form modified regions in the substrate, an intensity of laser light that reaches the second p-type semiconductor layer being reduced by the first p-type semiconductor layer during the irradiating; and dividing the wafer into light emitting elements at the modified regions as a starting point.

2. The method of manufacturing a light emitting element according to claim 1, wherein the first p-type semiconductor layer is doped with Mg as a dopant.

3. The method of manufacturing a light emitting element according to claim 1, wherein the first p-type semiconductor layer has a thickness of 10 nm or more.

4. The method of manufacturing a light emitting element according to claim 2, wherein the first p-type semiconductor layer has a thickness of 10 nm or more.

5. The method of manufacturing a light emitting element according to claim 1, wherein the first p-type semiconductor layer has a dopant concentration in a range of $10^{17}$ cm$^{-3}$ to $10^{21}$ cm$^{-3}$.

6. The method of manufacturing a light emitting element according to claim 2, wherein the first p-type semiconductor layer has a dopant concentration in a range of $10^{17}$ cm$^{-3}$ to $10^{21}$ cm$^{-3}$.

7. The method of manufacturing a light emitting element according to claim 1, wherein the semiconductor layered body is etched to remove a portion of the second p-type semiconductor layer.

8. The method of manufacturing a light emitting element according to claim 2, wherein the semiconductor layered body is etched to remove a portion of the second p-type semiconductor layer.

9. The method of manufacturing a light emitting element according to claim 1, wherein the semiconductor layered body includes an undoped nitride semiconductor layer between the first p-type semiconductor layer and the second n-type semiconductor layer.

10. The method of manufacturing a light emitting element according to claim 2, wherein the semiconductor layered body includes an undoped nitride semiconductor layer between the first p-type semiconductor layer and the second n-type semiconductor layer.

11. The method of manufacturing a light emitting element according to claim 3, wherein the semiconductor layered body includes an undoped nitride semiconductor layer between the first p-type semiconductor layer and the second n-type semiconductor layer.

12. The method of manufacturing a light emitting element according to claim 1, wherein the buffer layer is formed in contact with the upper surface of the substrate.

13. The method of manufacturing a light emitting element according to claim 2, wherein the buffer layer is formed in contact with the upper surface of the substrate.

14. The method of manufacturing a light emitting element according to claim 1, wherein in irradiating the substrate with laser light, the laser light is applied with a light condensing point adjusted inside of the substrate along each of the predetermined cleaving lines in plan view to create the modified region for cleaving the wafer along the predetermined cleaving lines into the plurality of individual light emitting elements.

15. The method of manufacturing a light emitting element according to claim 2, wherein in irradiating the substrate with laser light, the laser light is applied with a light condensing point adjusted inside of the substrate along each of the predetermined cleaving lines in plan view to create the modified region for cleaving the wafer along the predetermined cleaving lines into the plurality of individual light emitting elements.

16. The method of manufacturing a light emitting element according to claim 1, wherein in irradiating the substrate with laser light, femtosecond laser light having a central wavelength in the range of 500 nm to 1100 nm is used as the laser light.

17. The method of manufacturing a light emitting element according to claim 2, wherein in irradiating the substrate with laser light, femtosecond laser light having a central wavelength in the range of 500 nm to 1100 nm is used as the laser light.

18. A method of manufacturing a light emitting element, the method comprising:

providing a wafer including a substrate;

forming a semiconductor layered body on an upper surface of the substrate by:

forming a buffer layer of a nitride semiconductor on an upper surface of the substrate opposite to a lower surface of the substrate;

forming a first n-type semiconductor layer of an undoped nitride semiconductor on the buffer layer formed on the substrate;

forming a first p-type semiconductor layer of a nitride semiconductor on the first n-type semiconductor layer formed on the buffer layer;

forming the first p-type semiconductor layer with a flat upper surface;

forming a second n-type semiconductor layer of a nitride semiconductor on the flat upper surface of the first p-type semiconductor layer formed on the first n-type semiconductor layer;

connecting an n-side electrode to the second n-type semiconductor layer;

forming an active layer of a nitride semiconductor on the second n-type semiconductor layer formed on the first n-type semiconductor layer;

forming a second p-type semiconductor layer of a nitride semiconductor on the active layer formed on the second n-type semiconductor layer; and connecting a p-side electrode to the second p-type semiconductor layer; and irradiating the substrate with laser light from a side of the lower surface of the substrate to singulate the wafer into individual light emitting elements, an intensity of laser light that reaches the second p-type semiconductor layer being reduced by the first p-type semiconductor layer during the irradiating.

19. The method of manufacturing a light emitting element according to claim 1, further comprising: annealing the first p-type semiconductor layer and the second p-type semiconductor layer after forming the semiconductor layered body.

20. The method of manufacturing a light emitting element according to claim 1, wherein the step of irradiating the substrate with laser light from the side of the lower surface of the substrate causes light to reach the first p-type semiconductor layer which acts as a light absorbing layer, thereby avoiding a formation of damage caused by laser light in the second p-type semiconductor layer during the manufacturing of the light emitting element.

21. The method of manufacturing a light emitting element according to claim 1, wherein the flat upper surface of the first p-type semiconductor layer is entirely flat from a first end to a second end of a first one of the light emitting elements after the dividing of the wafer.

22. The method of manufacturing a light emitting element according to claim 18, further comprising: annealing the first p-type semiconductor layer and the second p-type semiconductor layer after forming the semiconductor layered body.

23. The method of manufacturing a light emitting element according to claim 1, wherein the first p-type semiconductor layer has a thickness larger than 10 nm and smaller than 1000 nm that provides absorption of laser light.

24. The method of manufacturing a light emitting element according to claim 1, wherein the first p-type semiconductor layer includes Mg as an impurity, an impurity concentration being larger than about $1\times10^{19}$ cm$^{-3}$ and smaller than about $5\times10^{20}$ cm$^{-3}$.

25. The method of manufacturing a light emitting element according to claim 1, wherein the intensity of laser light that reaches the second p-type semiconductor layer is reduced by the first p-type semiconductor layer during an entirety of the irradiating.

26. The method of manufacturing a light emitting element according to claim 18, wherein the first p-type semiconductor layer has a thickness larger than 10 nm and smaller than 1000 nm that provides absorption of laser light.

27. The method of manufacturing a light emitting element according to claim 18, wherein the first p-type semiconductor layer includes Mg as an impurity, an impurity concentration being larger than about $1\times10^{19}$ cm$^{-3}$ and smaller than about $5\times10^{20}$ cm$^{-3}$.

28. The method of manufacturing a light emitting element according to claim 18, wherein the intensity of laser light that reaches the second p-type semiconductor layer is reduced by the first p-type semiconductor layer during an entirety of the irradiating.

* * * * *